(12) United States Patent
Baek et al.

(10) Patent No.: US 12,525,586 B2
(45) Date of Patent: Jan. 13, 2026

(54) SEMICONDUCTOR PACKAGE

(71) Applicant: SAMSUNG ELECTRONICS CO., LTD., Suwon-si (KR)

(72) Inventors: Joonghyun Baek, Suwon-si (KR); Yuduk Kim, Suwon-si (KR); Hyunsoo Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 18/202,375

(22) Filed: May 26, 2023

(65) Prior Publication Data

US 2024/0088108 A1 Mar. 14, 2024

(30) Foreign Application Priority Data

Sep. 13, 2022 (KR) ................. 10-2022-0114702

(51) Int. Cl.
*H01L 25/10* (2006.01)
*H01L 23/00* (2006.01)
*H01L 23/498* (2006.01)

(52) U.S. Cl.
CPC ...... *H01L 25/105* (2013.01); *H01L 23/49827* (2013.01); *H01L 24/09* (2013.01); *H01L 24/16* (2013.01); *H01L 24/32* (2013.01); *H01L 24/73* (2013.01); *H01L 2224/0903* (2013.01); *H01L 2224/16148* (2013.01); *H01L 2224/16157* (2013.01); *H01L 2224/26145* (2013.01); *H01L 2224/32145* (2013.01); *H01L 2224/73204* (2013.01); *H01L 2924/2064* (2013.01)

(58) Field of Classification Search
CPC ......... H01L 25/105; H01L 2224/26145; H01L 23/49827
See application file for complete search history.

(56) References Cited

U.S. PATENT DOCUMENTS

| 7,030,487 | B1 | 4/2006 | Keng |
| 8,441,123 | B1 * | 5/2013 | Lee ...................... H01L 21/563 |
| | | | 257/737 |
| 9,390,997 | B2 | 7/2016 | Kim et al. |
| 9,984,950 | B2 | 5/2018 | Kim et al. |

(Continued)

FOREIGN PATENT DOCUMENTS

KR   10-2024-0024672   2/2024

*Primary Examiner* — Errol V Fernandes
(74) *Attorney, Agent, or Firm* — Morgan, Lewis & Bockius LLP

(57) ABSTRACT

A semiconductor package includes: a base chip; semiconductor chips disposed on the base chip and including front pads disposed on a front surface opposing the base chip, rear pads disposed on a rear surface opposing the front surface, and through-vias; bumps disposed between the semiconductor chips; a dam structure disposed on at least a portion of the rear pads; and insulating adhesive layers at least partially surrounding the bumps and the dam structure, wherein the rear pads include first pads that are disposed in a center region that crosses a center of the rear surface and that are electrically connected to the through-vias, and second pads that are disposed in a peripheral region adjacent to the center region, wherein the second pads include a line pad of which at least a portion has a polygonal shape, and wherein the dam structure has a bent shape.

20 Claims, 15 Drawing Sheets

(56) References Cited

U.S. PATENT DOCUMENTS

| | | |
|---|---|---|
| 10,192,855 B2 | 1/2019 | Seo et al. |
| 10,930,613 B2* | 2/2021 | Park ................... H01L 23/3192 |
| 11,037,853 B1 | 6/2021 | Chan et al. |
| 2021/0074660 A1* | 3/2021 | Lee ........................ H01L 24/05 |
| 2021/0343616 A1 | 11/2021 | Choi et al. |
| 2022/0115292 A1 | 4/2022 | Choi |
| 2023/0117654 A1* | 4/2023 | Kim ........................ H01L 23/16 |
| | | 257/723 |
| 2024/0063155 A1 | 2/2024 | Chung et al. |
| 2024/0321708 A1* | 9/2024 | Lee ........................ H01L 24/29 |

* cited by examiner

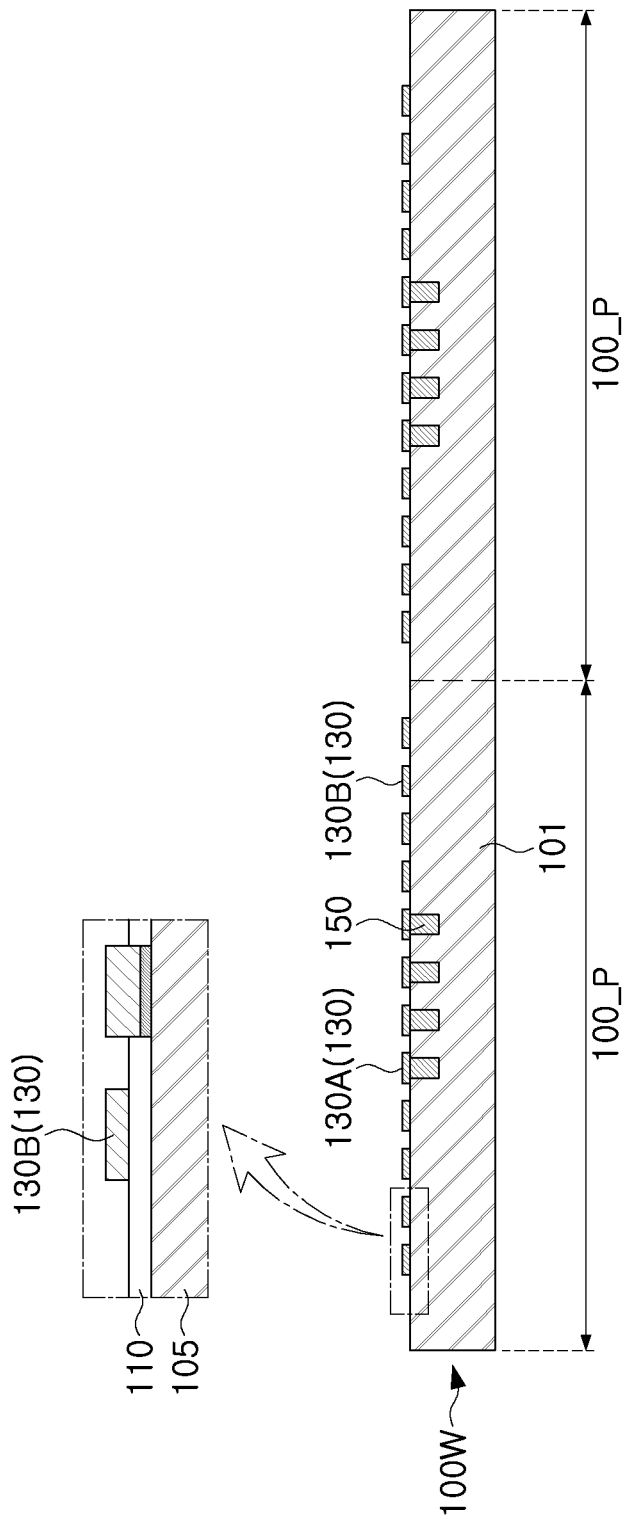
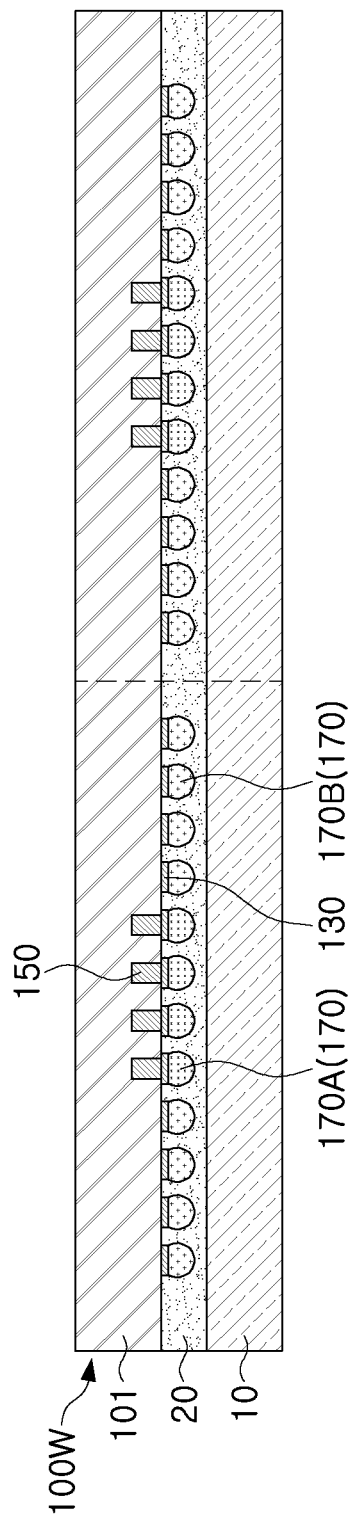
FIG. 11A
FIG. 11B

SEMICONDUCTOR PACKAGE

CROSS-REFERENCE TO RELATED APPLICATION

This application claims priority under 35 U.S.C. § 119(a) to Korean Patent Application No. 10-2022-0114702, filed on Sep. 13, 2022, in the Korean Intellectual Property Office, the disclosure of which is incorporated by reference herein in its entirety.

TECHNICAL FIELD

The present inventive concept relates to a semiconductor package.

DISCUSSION OF THE RELATED ART

With the trend for electronic devices having a reduced size and increased performance, reduced size and increased performance have also been desired in the field of semiconductor packages. To provide semiconductor packages with increased miniaturization, a relatively light weight, high performance, high capacity, and high reliability, semiconductor packages having a structure in which semiconductor chips are stacked in multiple layers have been under development.

SUMMARY

According to an example embodiment of the present inventive concept, a semiconductor package includes: a base chip, semiconductor chips disposed on the base chip and including front pads disposed on a front surface opposing the base chip, rear pads disposed on a rear surface opposing the front surface, and through-vias; bumps disposed between the semiconductor chips; a dam structure disposed on at least a portion of the rear pads; and insulating adhesive layers at least partially surrounding the bumps and the dam structure, wherein the rear pads include first pads that are disposed in a center region that crosses a center of the rear surface and that are electrically connected to the through-vias, and second pads that are disposed in a peripheral region adjacent to the center region, wherein the second pads include a line pad of which at least a portion has a polygonal shape, and wherein the dam structure has a bent shape.

According to an example embodiment of the present inventive concept, a semiconductor package includes: a first semiconductor chip including first front pads and first rear pads; a second semiconductor chip including second front pads and second rear pads opposing the first rear pads; bumps disposed between the first semiconductor chip and the second semiconductor chip; a dam structure disposed in an edge region of a rear surface of the first semiconductor chip; and an insulating adhesive layer at least partially surrounding the bumps and the dam structure, wherein each of the first rear pads and the second rear pads includes a dummy pad and a line pad, wherein the line pad has a length, equal to or greater than about twice a diameter of the dummy pad or equal to or greater than about twice a width of the dummy pad in a length direction, and wherein the dam structure is disposed on the line pad and has a bent shape.

According to an example embodiment of the present inventive concept, a semiconductor package includes: a base chip including lower bumps; semiconductor chips disposed on the base chip, and including front pads, rear pads, and through-vias, wherein the front pads are disposed on front surfaces, facing away from the base chip, of the semiconductor chips, wherein the rear pads are disposed on rear surfaces, opposing the front surfaces, of the semiconductor chips, and through-vias; bumps disposed between the semiconductor chips; a dam structure disposed on at least a portion of the rear pads; and insulating adhesive layers at least partially surrounding the bumps and the dam structure, wherein the rear pads include first pads, which are disposed in a center region that crosses a center of each of the rear surfaces and are electrically connected to the through-vias, and second pads that are disposed in a peripheral region around the center region, and wherein the second pads include a first line pad, extending in a first direction, and a second line pad extending in a second direction, intersecting the first direction.

BRIEF DESCRIPTION OF DRAWINGS

The above and other aspects of the present inventive concept will become more apparent by describing in detail example embodiments thereof, with reference to the accompanying drawings, in which:

FIGS. 11A, 11B, 11C and 11D are cross-sectional views illustrating a process flow of manufacturing a semiconductor package according to an example embodiment of the present inventive concept.

DETAILED DESCRIPTION OF THE EMBODIMENTS

Hereinafter, example embodiments will be described with reference to the accompanying drawings.

Figure 1:
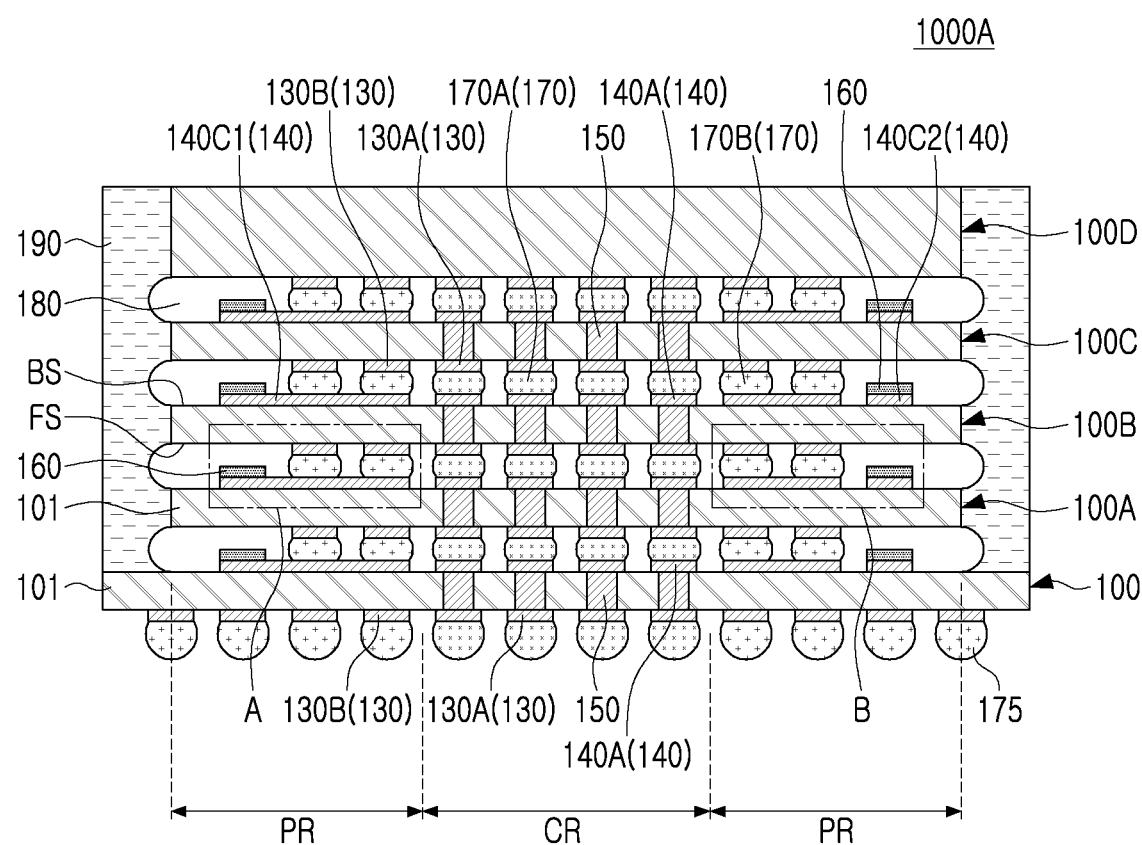
FIG. 1 is a cross-sectional view illustrating a semiconductor package according to an example embodiment of the present inventive concept.

FIG. 1 is a cross-sectional view illustrating a semiconductor package according to an example embodiment of the present inventive concept.

Figure 2:
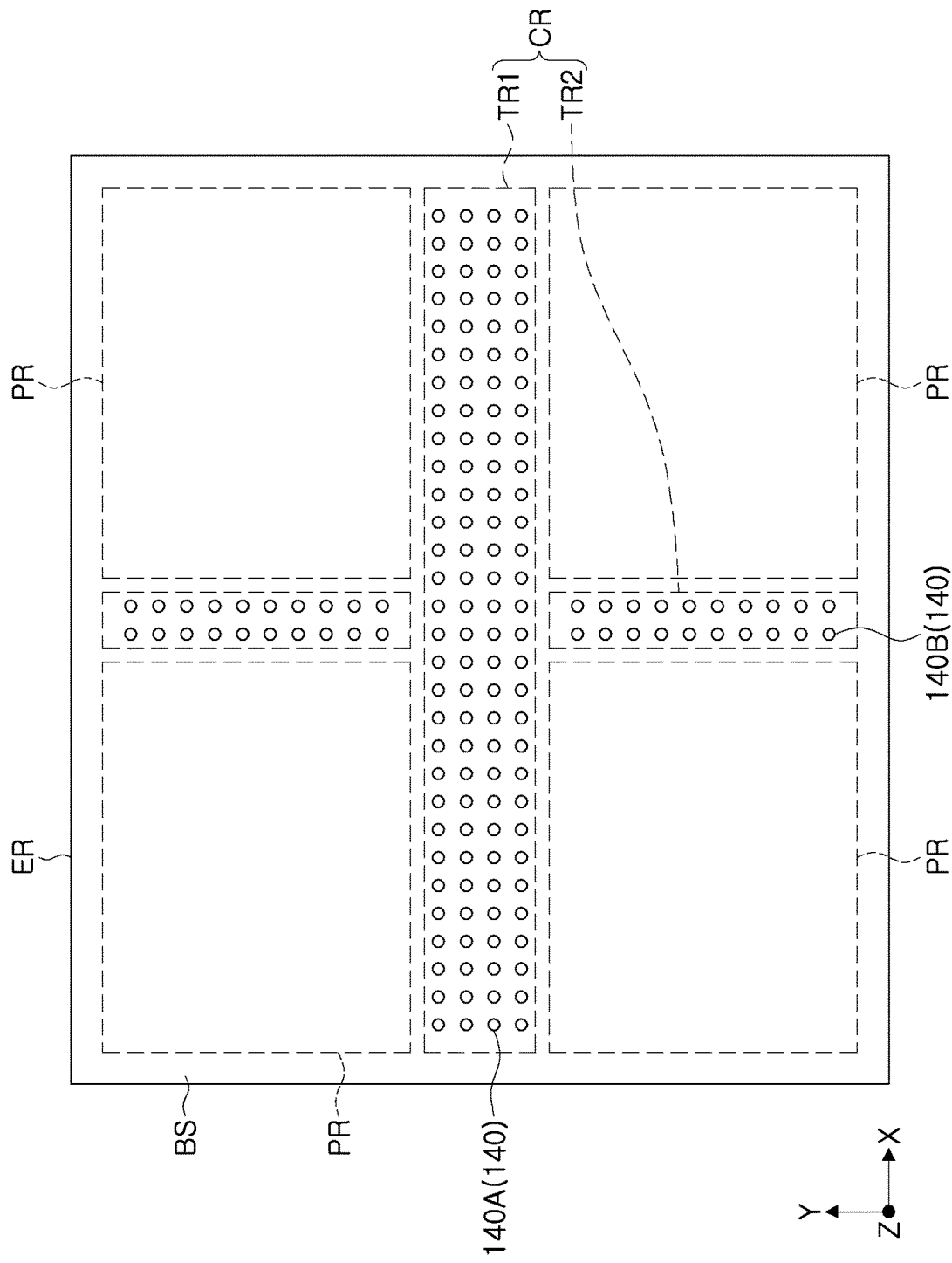
FIG. 2 is a conceptual plan view illustrating rear regions of a semiconductor chip of a semiconductor package according to an example embodiment of the present inventive concept.

FIG. 2 is a conceptual plan view illustrating rear regions of a semiconductor chip of a semiconductor package according to an example embodiment of the present inventive concept.

Figure 3A:
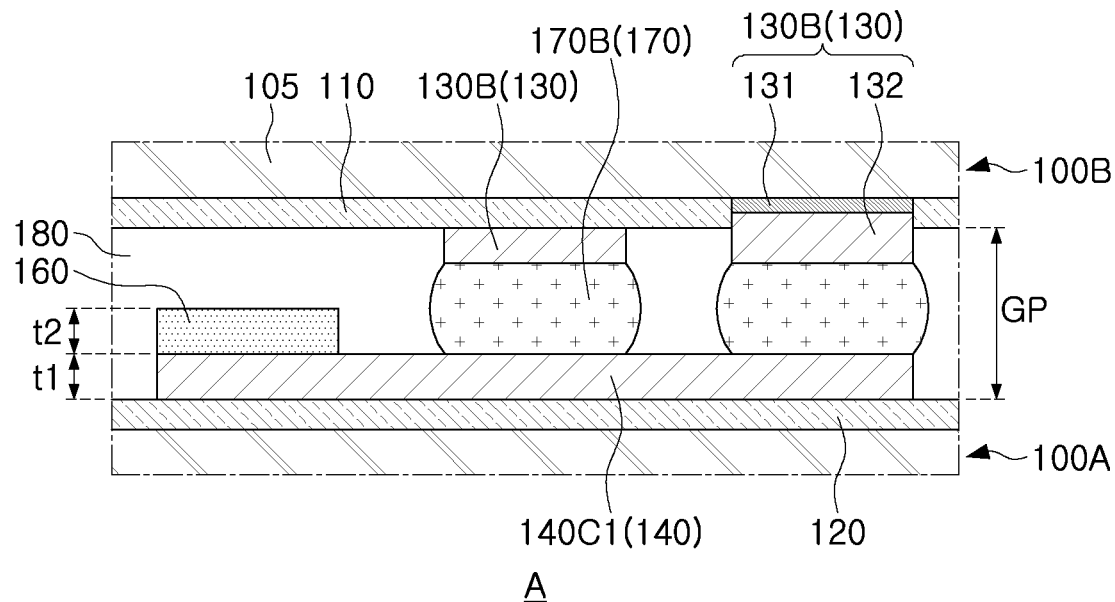
FIGS. 3A and 3B are partially enlarged views of a semiconductor package according to an example embodiment of the present inventive concept.
Figure 3B:
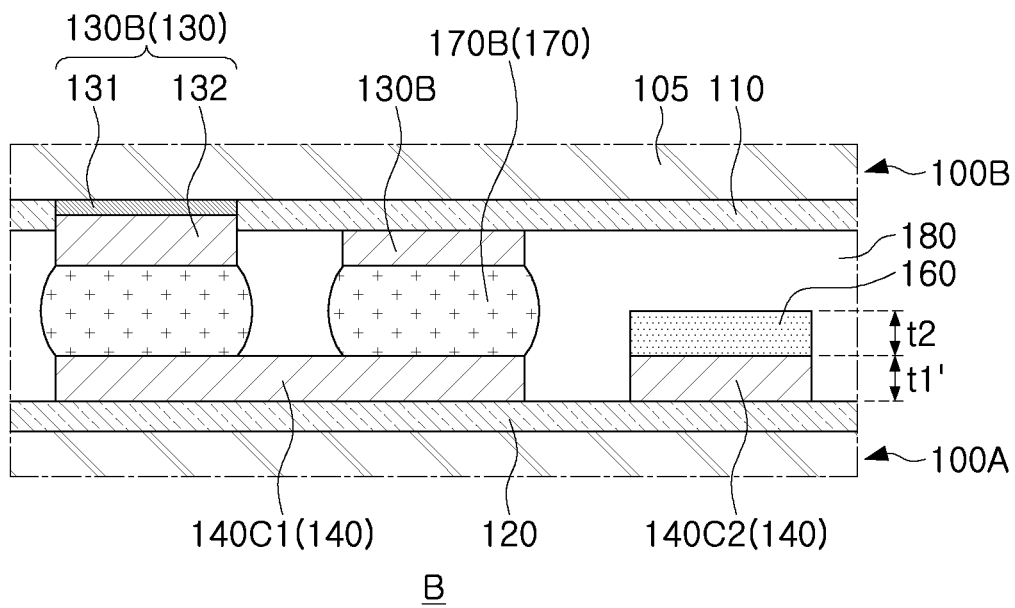

FIGS. 3A and 3B are partially enlarged views of a semiconductor package according to an example embodiment of the present inventive concept. FIG. 3A is an enlarged view of region "A" of FIG. 2, and FIG. 3B is an enlarged view of region "B" of FIG. 2.

Referring to FIGS. 1 to 3B, a semiconductor package 1000A according to an example embodiment of the present inventive concept may include a base chip 100, a plurality of semiconductor chips 100A, 100B, 100C, and 100D, a plurality of dam structures 160, a plurality of bumps 170, a plurality of insulating adhesive layers 180, and an encapsulant 190.

The plurality of semiconductor chips 100A, 100B, 100C, and 100D may be stacked on the base chip 100. The base chip 100 may be, for example, a buffer chip including a plurality of logic devices and/or memory devices disposed on a front active layer. Accordingly, the base chip 100 may transmit signals from the plurality of semiconductor chips 100A, 100B, 100C, and 100D stacked thereon to an external entity (e.g., circuit and/or device) through the lower bump 175, and may also transmit signals and power from the external entity to the plurality of semiconductor chips 100A, 100B, 100C, and 100D.

The base chip 100 may perform both logic functions and memory functions through the logic devices and memory devices. In some example embodiments of the present inventive concept, the base chip 100 may include only logic devices to perform only logic functions. The base chip 100 may have a width, greater than a width of each of the plurality of semiconductor chips 100A, 100B, 100C, and 100D. As another example, the base chip 100 may be an interposer on which the plurality of semiconductor chips 100A, 100B, 100C, and 100D are mounted.

Various types of devices may be disposed on the base active layer of the base chip 100. For example, the base active layer of the base chip 100 may include an active device and/or a passive device, for example, a field effect transistor (FET) such as a planar FET or a FinFET, a memory such as a flash memory, a dynamic random access memory (DRAM), a static random access memory (SRAM), an electrically erasable programmable read-only memory (EEPROM), a phase change random access memory (PRAM), a magnetoresistive random access memory (MRAM), a ferroelectric random access memory (FeRAM), or a resistive random access memory (ReRAM), a logic gate such as an AND, OR, or NOT gate, a system large scale integration (LSI), a CMOS images sensor, or a micro-electro-mechanical system (MEMS). A plurality of wiring layers may be disposed on the base active layer of the base chip 100 to be electrically connected to the devices.

Lower bumps 175 may be disposed below the base chip 100. The lower bumps 175 may be disposed on the front pads 130 and may be electrically connected to the wiring layers of the base active layer or the through-vias 150 of the base chip 100. Each of the lower bumps 175 may be formed of a solder ball. In some embodiments of the present inventive concept, the lower bumps 175 may have a structure including a pillar and a solder. The semiconductor package 1000A may be mounted on an external substrate, such as a mainboard, through the lower bumps 175.

The plurality of semiconductor chips 100A, 100B, 100C, and 100D may be disposed such that the front surfaces FS thereof are directed to face the base chip 100. The plurality of semiconductor chips 100A, 100B, 100C, and 100D may be electrically connected to each other through the plurality of bumps 170 disposed below each of the plurality of semiconductor chips 100A, 100B, 100C, and 100D. The plurality of semiconductor chips 100A, 100B, 100C, and 100D may be stacked with a gap region therebetween, and a height of the gap region ('GP' of FIG. 3A) may range from about 7 μm to about 20 μm. The number of semiconductor chips is not limited to the number of semiconductor chips illustrated in the drawings and may vary according to example embodiments of the present inventive concept.

In an example, the base chip 100 may include a plurality of logic devices and/or memory devices and may be referred to as a buffer chip or a control chip according to a function thereof, while each of the plurality of semiconductor chips 100A, 100B, and 100C, 100D may include a plurality of memory devices and may be referred to as a core chip. In addition, the base chip 100 may be referred to as a first semiconductor chip, and the semiconductor chips 100A, 100B, 100C, and 100D may be referred to as second semiconductor chips.

FIGS. 3A and 3B are enlarged views of a rear structure of the first semiconductor chip 100A and a front structure of the second semiconductor chip 100B. For example, the rear structure of the first semiconductor chip 100A may be adjacent to a first side of the semiconductor package 1000A, and the front structure of the second semiconductor chip 100B may be adjacent to a second side, opposite to the first side, of the semiconductor package 1000A. The rear structure of the first semiconductor chip 100A may include a rear insulating layer 120, rear pads 140, and dam structures 160, and the front structure of the second semiconductor chip 100B may include active layer 105, a front insulating layer 110, and front pads 130. Each of the base chip 100, the first semiconductor chip 100A, the third semiconductor chip 100C, and the fourth semiconductor chip 100D may have a structure, similar to the front structure of the second semiconductor chip 100B, and each of the base chip 100, the second semiconductor chip 100B, and the third semiconductor chip 100C may have a structure, similar to the rear structure of the first semiconductor chip 100A.

The base chip 100 and the first to third semiconductor chips 100A, 100B, and 100C may further include a substrate 101 and through-vias 150 (e.g., base through electrodes) penetrating through the substrate 101. The through-vias 150 may be electrically connected to a portion of the front pads 130 and a portion of the rear pads 140. The through-vias 150 may be through-silicon vias (TSVs).

The substrate 101 may include, for example, a semiconductor element such as silicon (Si) or germanium (Ge), or a compound semiconductor such silicon carbide (SiC), gallium arsenide (GaAs), indium arsenide (InAs), or indium phosphide (InP). According to some example embodiments of the present inventive concept, the substrate 101 may have a silicon-on-insulator (SOI) structure. The substrate 101 may include a conductive region, for example, a well doped with impurities or a structure doped with impurities. The substrate 101 may include various isolation structures such as a shallow trench isolation (STI) structure.

The active layer 105 may include a plurality of memory devices. For example, the active layer 105 may include volatile memory devices such as DRAM and SRAM, or nonvolatile memory devices such as PRAM, MRAM, FeRAM, and RRAM. For example, in the semiconductor package 1000A according to the present embodiment, DRAM devices may be disposed on the active layers 105 of the plurality of semiconductor chips 100A, 100B, 100C, and 100D. Accordingly, the semiconductor package 1000A according to the present embodiment may be used in a high-bandwidth memory (HBM) product, an electro data processing (EDP) product. The active layer 105 may include interlayer insulating layers and a plurality of wiring layers electrically connected to the memory devices in the active layer 105. The memory devices of the active layer 105 may be electrically connected to the plurality of bumps 170 through the wiring layers.

The front insulating layer 110 may include an organic material such as photosensitive polyimide. The back insulating layer 120 may include at least one of, for example, a silicon oxide, a silicon nitride, and/or a silicon oxynitride. The front insulating layer 110 and the rear insulating layer 120 may include a single layer or a plurality of layers.

The front pads 130 may be disposed on a surface of the front insulating layer 110 and/or may be disposed through the front insulating layer 110. The front pads 130 may include first front pads 130A, electrically connected to the through-vias 150, and second front pads 130B disposed in an external region of the first front pads 130A. The second front pads 130B may be spaced apart from the through-vias 150 and might not be electrically connected to the through-vias 150. At least a portion of the second front pads 130B may include a first pad material layer 131 and a second pad material layer 132, as illustrated in FIGS. 3A and 3B. The front pads 130 may include at least of, for example, aluminum (Al), copper (Cu), nickel (Ni), titanium (Ti), tantalum (Ta), tungsten (W), platinum (Pt), and/or gold (Au).

The rear pads 140 may be disposed on the rear insulating layer 120. The rear pads 140 may be disposed on a surface of one of the base chip 100 and the first to third semiconductor chips 100A, 100B, and 100C (hereinafter referred to as a "rear surface of the semiconductor chip (BS in FIG. 2)"). As illustrated in FIG. 2, the rear surface BS of the semiconductor chip may include a TSV pad region TR1, a test pad region TR2, and a peripheral region PR. The rear pads 140 may include TSV pads 140A disposed in the TSV pad region TR1, test pads 140B disposed in the test pad region TR2, and peripheral pads 140C1 and 140C2 disposed in the peripheral region PR. The TSV pads 140A may be arranged in a plurality of rows and columns along the TSV pad region TR1 crossing a center of the rear surface BS of the semiconductor chip in an X-direction. The test pads 140B may be arranged in a plurality of rows and columns along the test pad region TR2 crossing the center of the rear surface BS of the semiconductor chip in a Y-direction. The TSV pad region TR1 and the test pad region TR2 may be referred to as a "center region CR." The peripheral region PR may be disposed around the center region CR.

Figure 6A:
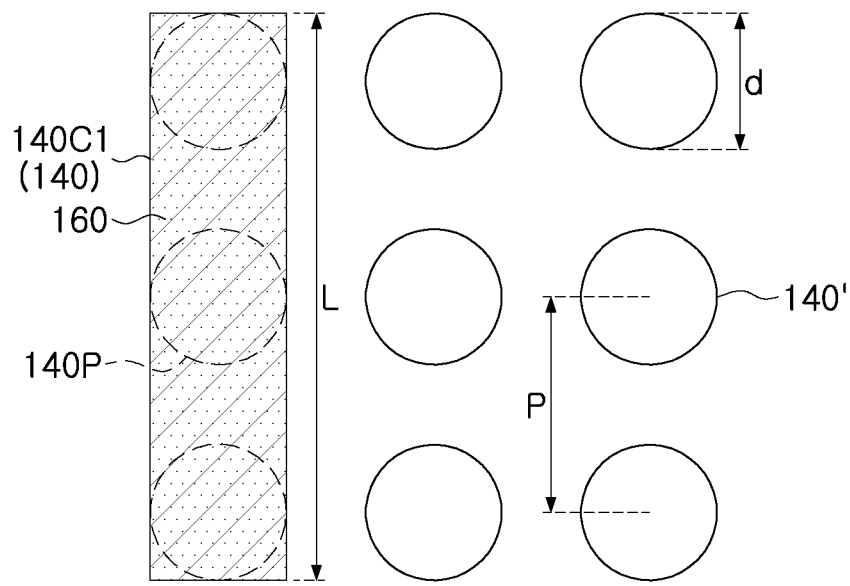
FIGS. 6A, 6B, 6C and 6D are schematic diagrams illustrating rear pads of a semiconductor package according to an example embodiment of the present inventive concept.

The peripheral pads 140C1 and 140C2 might not be electrically connected to the through vias 150, and may be spaced apart from the through vias 150. In addition, the peripheral pads 140C1 and 140C2 might not vertically overlap the through vias 150. The peripheral pads 140C1 and 140C2 may include, for example, a line pad 140C1 having at least a portion of a line shape on a plane, as illustrated in FIG. 6A. For example, the line pad 140C1 may have a polygonal shape such as a rectangular shape. Since the line pad 140C1 is elongated to have a line shape in at least one direction, at least two second bumps 170B and at least two second front pads may be disposed on the line pad 140C1, as illustrated in FIG. 3A. For example, the line pad 140C1 may vertically overlap at least two front pads 130B. A thickness t1 of the line pad 140C1 may range from about 1.5 μm to about 3 μm. A length of the line pad 140C1 may be greater than a width or a diameter of each of the other pads 140A and 140B.

A ratio of a metal on the rear surface BS of the semiconductor chip may be increased by the line pad 140C1 to increase heat dissipation. As confirmed by the applicant, a proportion of the metal disposed on the rear surface BS is increased by about 9% to about 28% with respect to an area by the line pad 140C1. Accordingly, a heat dissipation effect in a direction from a center of a chip to an external region of the chip may be further increased.

A dam structure 160 may be disposed on the line pad 140C1. An external pad 140C2, a portion of the peripheral pads 140C1 and 140C2, may have a circular or rectangular pad in plan view, and the dam structure 160 may be disposed thereon. Planar structures of the line pad 140C1 and the dam structure 160 will be further described below in FIG. 6A.

The through-vias 150 may penetrate through the substrate 101 in a vertical direction (e.g., a Z-direction) and may provide an electrical path connecting the front pad 130 and the rear pad 140 to each other. For example, each of the through-vias 150 may include a conductive plug and a barrier layer surrounding the conductive plug. The conductive plug may include a metal material such as tungsten (W), titanium (Ti), aluminum (Al), or copper (Cu). The conductive plug may be formed through, for example, a plating process, a physical vapor deposition (PVD) process or a chemical vapor deposition (CVD) process. For example, the barrier layer may include an insulating barrier layer and/or a conductive barrier layer. The insulating barrier layer may be formed of, for example, an oxide, a nitride, a carbide, a polymer, or combinations thereof. In an example, the conductive barrier layer may be disposed between the insulating barrier layer and the conductive plug. The conductive barrier layer may include, for example, a metal compound such as tungsten nitride (WN), titanium nitride (TiN), or tantalum nitride (TaN). The barrier layer may be formed by a PVD process or a CVD process.

Dam structures 160 may be disposed on at least a portion of the peripheral pads 140C1 and 140C2. For example, a portion of the dam structures 160 may be disposed on the line pad 140C1 or may be disposed on the peripheral pad 140C2. A thickness t2 of the dam structure 160 may range from about 0.5 times to about 2 times a thickness t1 of the line pad 140C1. The thickness t2 of the dam structure 160 may range from about 1.5 μm to about 3 μm. The dam structures 160 may be disposed to be adjacent to an edge region ER of the rear surface BS of the semiconductor chip. At least a portion of the dam structures 160 may have a line shape in an identical or similar manner to the line pad 140C1. The dam structures 160 may control flowability of the insulating adhesive layer 180 formed of non-conductive film (NCF). For example, the line pad 140C1 may serve as a barrier to block a flow of the insulating adhesive layer 180 in a region in which a fillet portion is relatively and readily formed due to thermal compression of the insulating adhesive layer 180. In addition, the dam structures 160 may increase a heat dissipation effect in a planar direction of the semiconductor chip.

The plurality of bumps 170 may be disposed between rear pads 140 of a lower semiconductor chip (for example, a first semiconductor chip 100A), among the plurality of semiconductor chips 100A, 100B, 100C, and 100D, and front pads 130 of an upper semiconductor chip (for example, a second semiconductor chip 100B) among the plurality of semiconductor chips 100A, 100B, 100C, and 100D. The bumps 170 may be disposed between the first semiconductor chip 100A and the base chip 100. The bumps 170 may electrically connect the plurality of semiconductor chips 100A, 100B, 100C, and 100D to the base chip 100.

Each of the bumps 170 may include, for example, a solder. In some example embodiments of the present inventive concept, each of the bumps 170 may include both a pillar and a solder. The pillar may have a cylindrical pillar shape or a polygonal pillar shape such as a rectangular pillar shape or an octagonal pillar shape, and may include, for example, nickel (Ni), copper (Cu), palladium (Pd), platinum (Pt), gold (Au) or combinations thereof. The solder has a spherical or ball shape, and may include, for example, tin (Sn), indium (In), bismuth (Bi), antimony (Sb), copper (Cu), silver (Ag), zinc (Zn), lead (Pb), and/or alloys thereof. The alloy may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like. Heights of the bumps 170 may be determined based on solder wetting in a reflow process.

The plurality of insulating adhesive layers 180 may be disposed on the rear surface BS of each of the plurality of semiconductor chips 100A, 100B, 100C, and 100D. The insulating adhesive layer 180 may be disposed between the base chip 100 and the lowermost first semiconductor chip 200A, among the plurality of semiconductor chips 100A, 100B, 100C, and 100D, and between the plurality of semiconductor chips 100A, 100B, 100C, and 100D. In addition, the insulating adhesive layer 180 may surround side surfaces of the plurality of bumps 170 and the dam structure 160. The plurality of insulating adhesive layers 180 may fix the plurality of semiconductor chips 100A, 100B, 100C, and 100D to the base chip 100.

The insulating adhesive layer 180 may extend to side surfaces of the semiconductor chips 100A, 100B, 100C, and 100D, adjacent to the rear surfaces BS of the semiconductor chips 100A, 100B, 100C, and 100D, for example, a side surface lower end portion of the semiconductor chips 100A, 100B, 100C, and 100D. For example, the insulating adhesive layer 180 may include an underfill internal portion, vertically overlapping the semiconductor chips 100A, 100B, 100C, and 100D, and an underfill external portion protruding outwardly of the underfill internal portion. The underfill external portion may protrude outwardly from a region between the semiconductor chips 100A, 100B, 100C, and 100D, to cover at least a portion of the side surfaces of the semiconductor chips 100A, 100B, 100C, and 100D. In an example, the underfill external portion may be referred to as a fillet portion. The degree and shape of protrusion of the underfill external portion may vary depending on process conditions, for example, conditions of a thermal compression process.

The insulating adhesive layer 180 may be a non-conductive film (NCF) or a molded underfill (MUF), but example embodiments of the present inventive concept are not limited thereto. The insulating adhesive layer 260 may include at least one of an epoxy resin, silica ($SiO_2$), or acrylic copolymer, or combinations thereof.

The encapsulant 190 may be disposed on the base chip 100, and may cover a portion of an upper surface of the base chip 100 and side surfaces of the plurality of insulating adhesive layers 180. The encapsulant 190 may cover a portion of side surfaces of the plurality of semiconductor chips 100A, 100B, 100C, and 100D. As illustrated in FIG. 1, the encapsulant 190 might not cover an upper surface of the fourth semiconductor chip 100D, and the upper surface of the fourth semiconductor chip 100D may be exposed from the encapsulant 190. In another example, the encapsulant 190 may have a predetermined thickness and may cover the upper surface of the fourth semiconductor chip 200D. The encapsulant 190 may include an insulating material, for example, an epoxy molding compound (EMC).

Figure 4A:
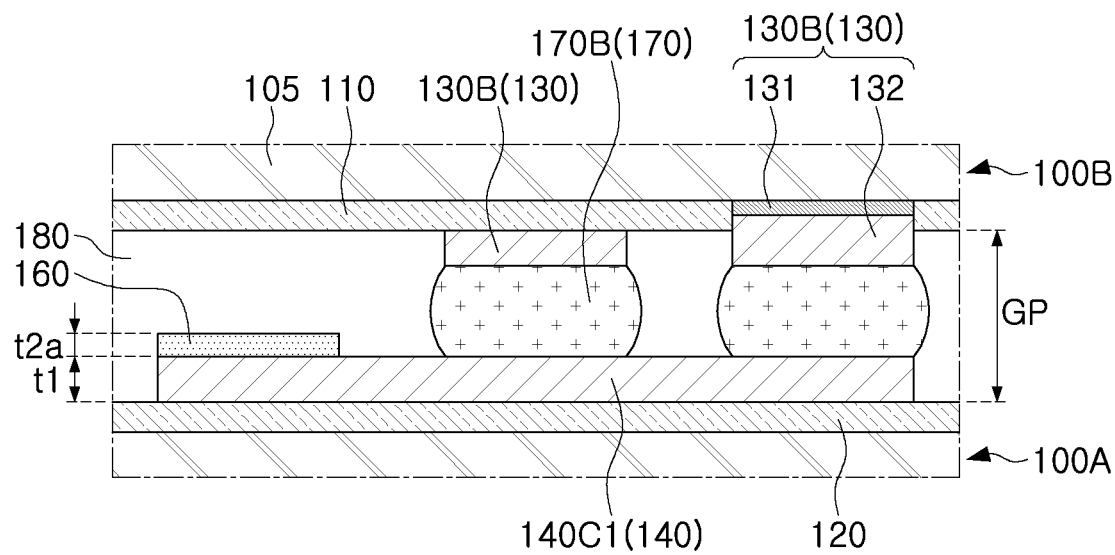
FIGS. 4A and 4B are partially enlarged views of a semiconductor package according to an example embodiment of the present inventive concept.
Figure 4B:
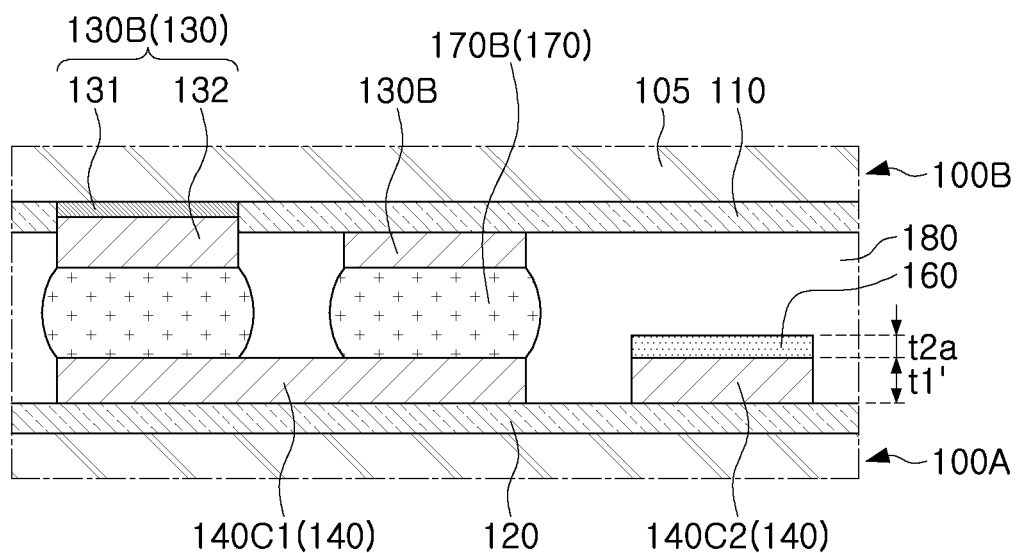

FIGS. 4A and 4B are partially enlarged views of a semiconductor package according to an example embodiment of the present inventive concept. FIG. 4A is an enlarged view of a region corresponding to region "A" of FIG. 1, and FIG. 4B is an enlarged view of a region corresponding to region "B" of FIG. 1.

Referring to FIGS. 4A and 4B, a thickness t2a of a dam structure 160 may be smaller than each of a thickness t1 of a line pad 140C1 and a thickness t1' of an external pad 140C2.

Figure 5A:
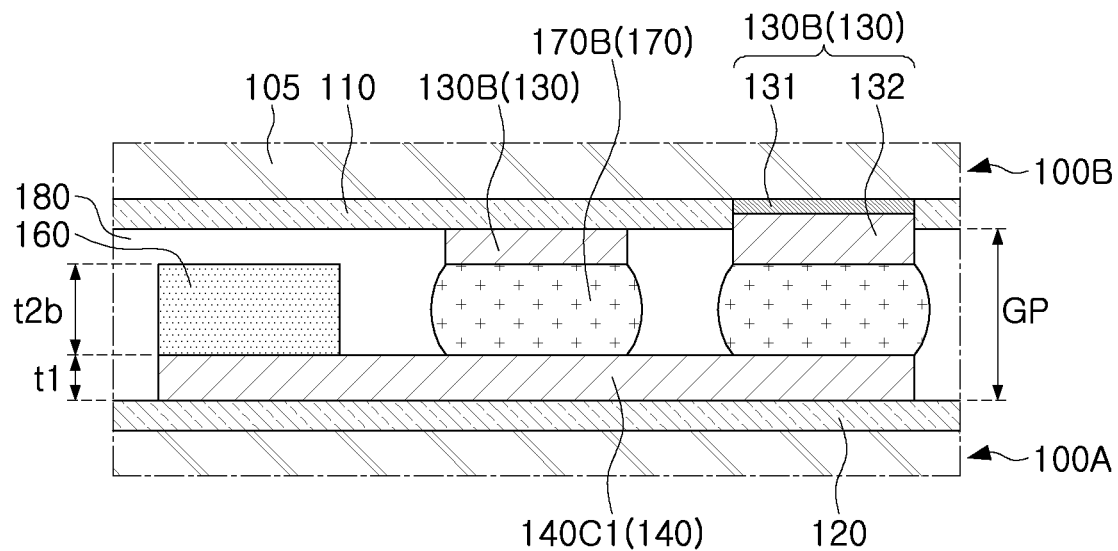
FIGS. 5A and 5B are partially enlarged views of a semiconductor package according to an example embodiment of the present inventive concept.
Figure 5B:
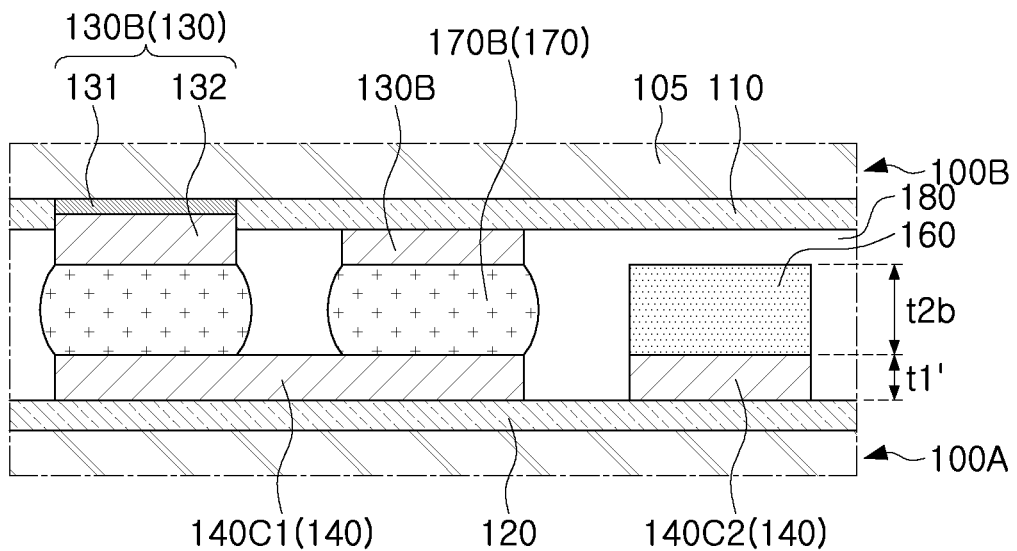

FIGS. 5A and 5B are partially enlarged views of a semiconductor package according to an example embodiment of the present inventive concept. FIG. 5A is an enlarged view of a region corresponding to region "A" of FIG. 1, and FIG. 5B is an enlarged view of a region corresponding to region "B" of FIG. 1.

Referring to FIGS. 5A and 5B, a thickness t2b of the dam structure 160 may be greater than each of a thickness t1 of the line pad 140C1 and a thickness t1' of an external pad 140C2.

FIGS. 6A to 6D are schematic diagrams illustrating rear pads of a semiconductor package according to an example embodiment of the present inventive concept.

Referring to FIGS. 6A to 6D, a rear pads 140 may include dummy pads 140' and a line pad 140C1, and a dam structure 160 may be disposed on the line pad 140C1. The dam structure 160 may have a planar shape corresponding to that of the line pad 140C1, or may have a planar shape, similar to that of the line pad 140C1, but partially different from that of the line pad 140C1. For example, the dam structure 160 may have a rectangular shape.

In FIG. 6A, the line pad 140C1 may be a pad, linearly extending in a position 140P of dummy pads 140' arranged in a line. The line pad 140C1 may have a length L, equal to or greater than twice a diameter d of the dummy pad 140' or equal to or greater than twice a width P in a length direction. The dam structure 160a may be disposed on the line pad 140C1. The diameter d of the dummy pad 140' may range from about 13 μm to about 20 μm. The length L of the line pad 140C1 may be about 30 μm or more, about 35 μm, about 40 μm, or about 45 μm or more.

Figure 6B:
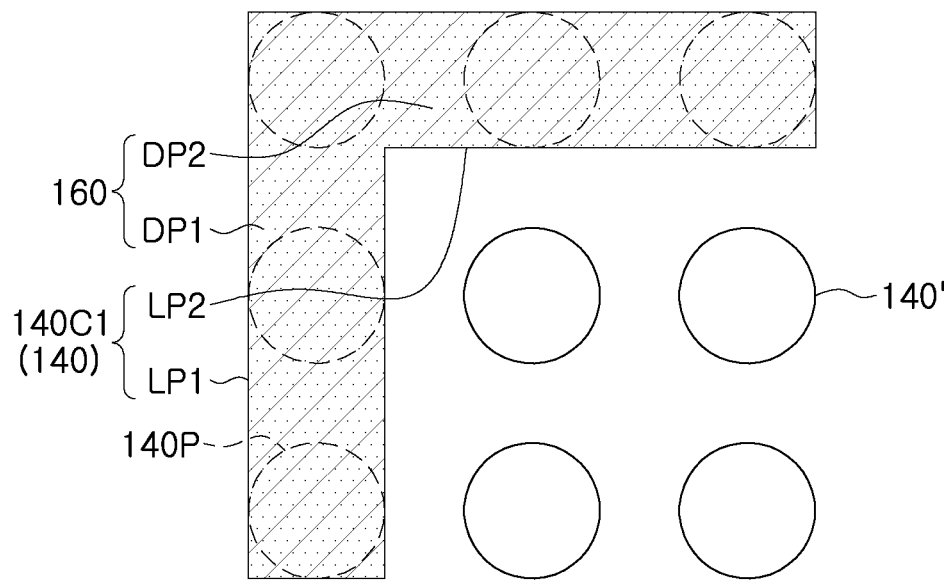

In FIG. 6B, a line pad 140C1 may include a bent portion in plan view. For example, the line pad 140C1 may include a first line portion LP1, extending in a first direction in plan view, and a second line portion LP2 extending in a second direction, intersecting the first direction, in plan view. Similarly to the line pad 140C1, the dam structure 160 may also include a bent portion in plan view. For example, the dam structure 160 may include a first dam line portion DP1, extending in the first direction, in plan view and a second dam line portion DP2 extending in the second direction in plan view.

Figure 6C:
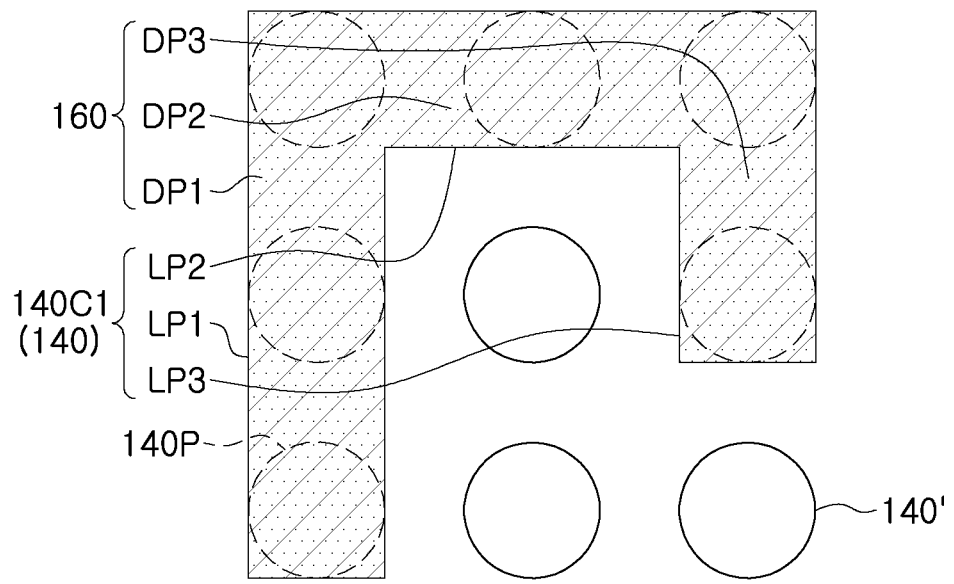

In FIG. 6C, a line pad 140C1 may include at least two bent portions in plan view. Similarly to the line pad 140C1, a dam structure 160 may also include at least two bent portions. For example, the line pad 140C1 may further include a third line portion LP3, connected to a second line portion LP2 and extending in a first direction in plan view, and the dam structure 160 may further include a third line portion LP3 connected to the second line portion LP2 and extending in the first direction in plan view.

Figure 6D:
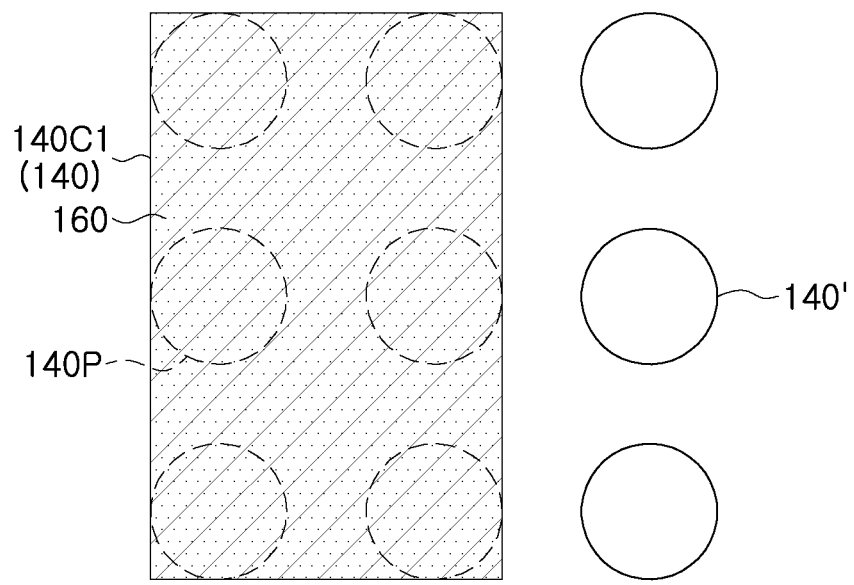
Figure 7A:
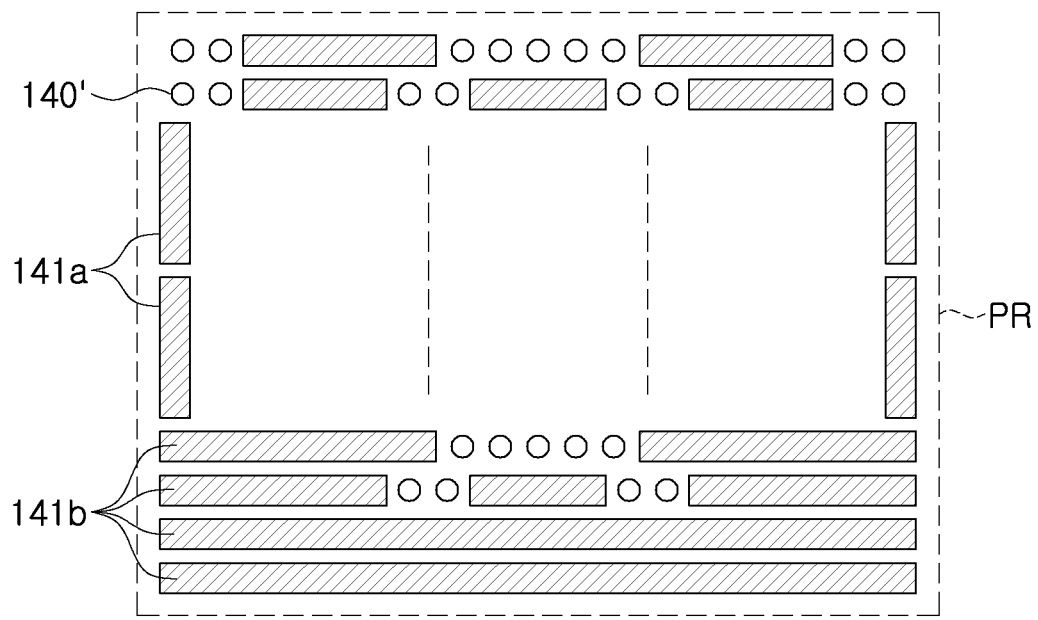
FIGS. 7A, 7B, 7C and 7D are plan views illustrating a portion of a semiconductor package according to an example embodiment of the present inventive concept.
Figure 7B:
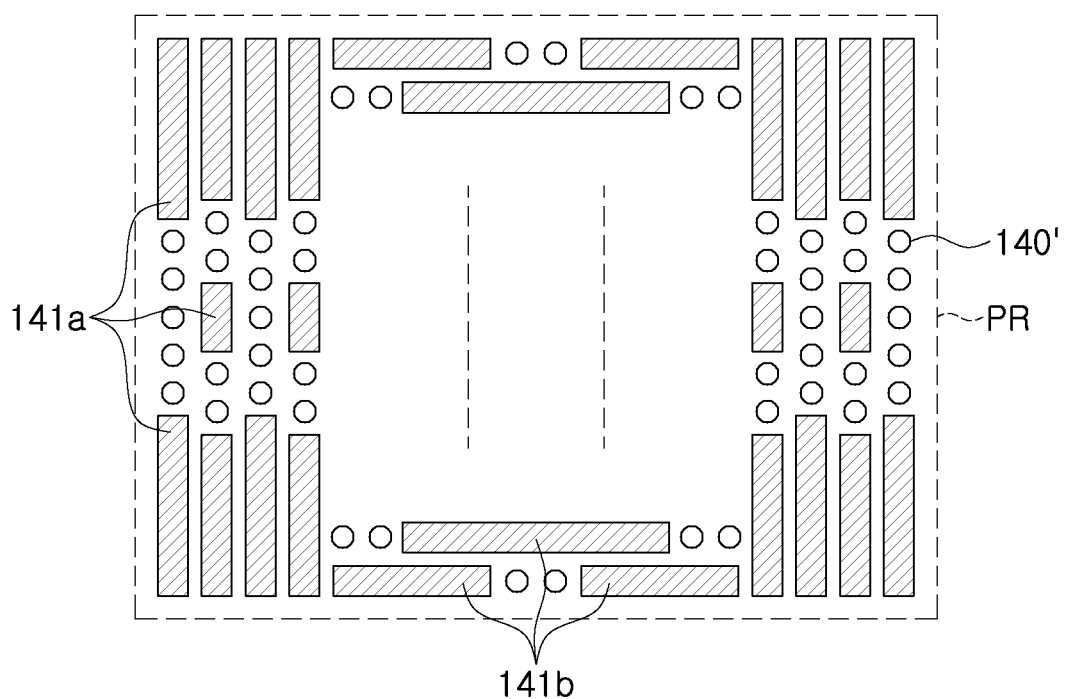
Figure 7C:
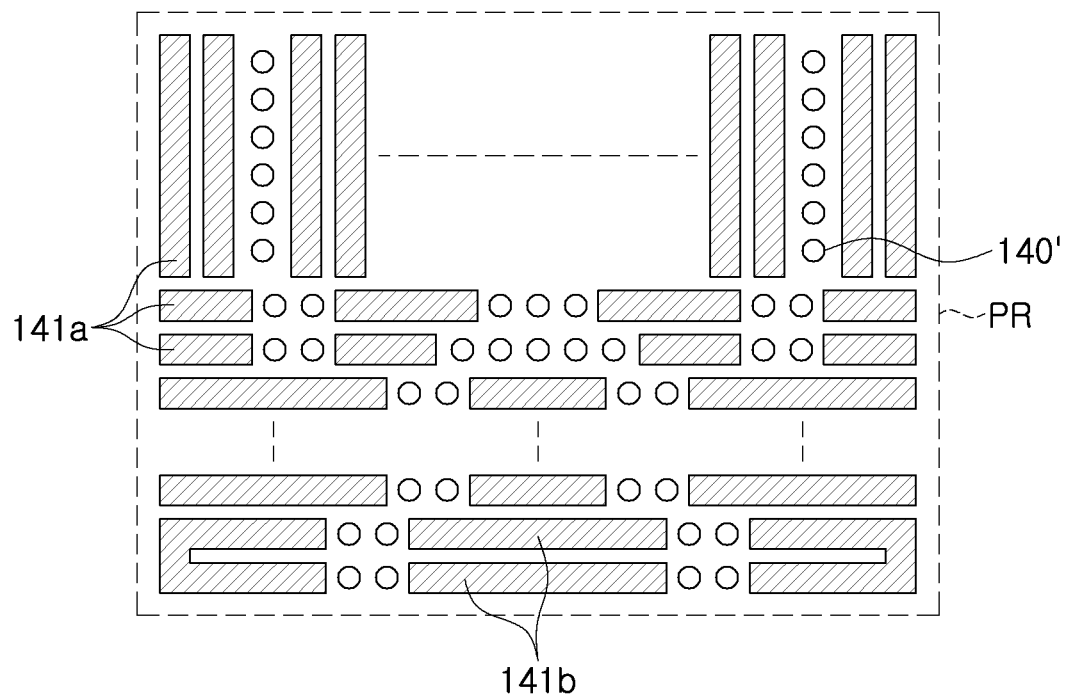
Figure 7D:
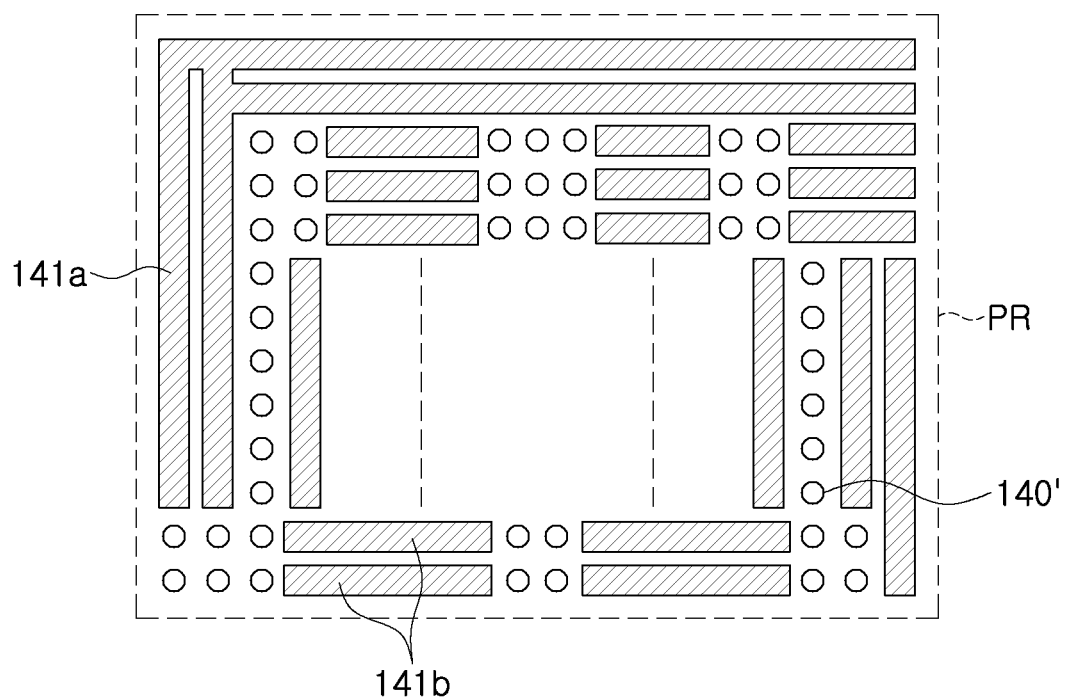

In FIG. 6D, a line pad 140C1 may be a pad, linearly extending in a position 140P of dummy pads 140' arranged in at least two lines in plan view. As compared with the line pad 140C1 of FIG. 6A, the line pad 140C1 may have a larger width in a width direction.

FIGS. 7A to 7D are plan views illustrating a portion of a semiconductor package according to an example embodiment of the present inventive concept. FIGS. 7A to 7D illustrate rear pads 140 disposed in the peripheral region PR of FIG. 2.

Referring to FIGS. 7A to 7l), first line pads 141a extending in a first direction, second line pads 141b extending in a second direction, and dummy pads 140' may be disposed. The first line pads 141a and the second line pads 141b may be disposed to be adjacent to an edge region ER to increase a heat dissipation effect in a planar direction of a semiconductor chip. In addition, a dam structure 160 may be disposed together on the line pads 141a and 141b, so that flowability of the insulating adhesive layer 180 may be controlled to prevent excessive formation of fillets.

Figure 8:
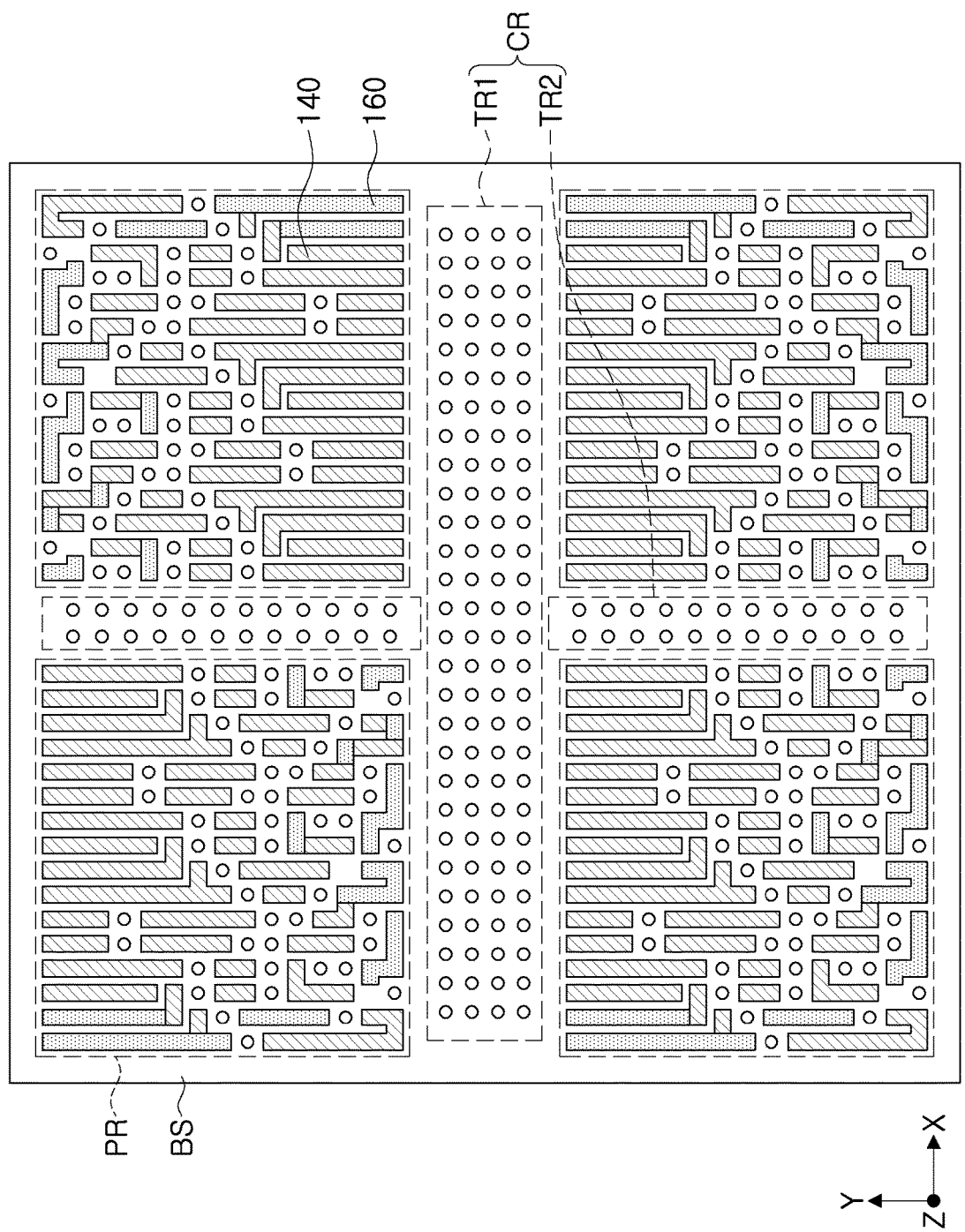
FIG. 8 is a plan view illustrating a semiconductor package according to an example embodiment of the present inventive concept.

FIG. 8 is a plan view illustrating a semiconductor package according to an example embodiment of the present inventive concept.

Referring to FIG. 8, rear pads 140 may have various shapes such as an I-shape, a reverse L-shape, an L-shape, and a C-shape. The dam structure 160 may have a shape the same as or similar to a shape of each of the rear pads 140. Among the rear pads 140, line-shaped pads may be appropriately disposed to be adjacent to an edge region ER to increase a heat dissipation effect in a planar direction of a semiconductor chip. In addition, the dam structure 160 may be disposed on the rear pads 140, so that flowability of an insulating adhesive layer 180 may be controlled to prevent excessive formation of fillets.

Figure 9:
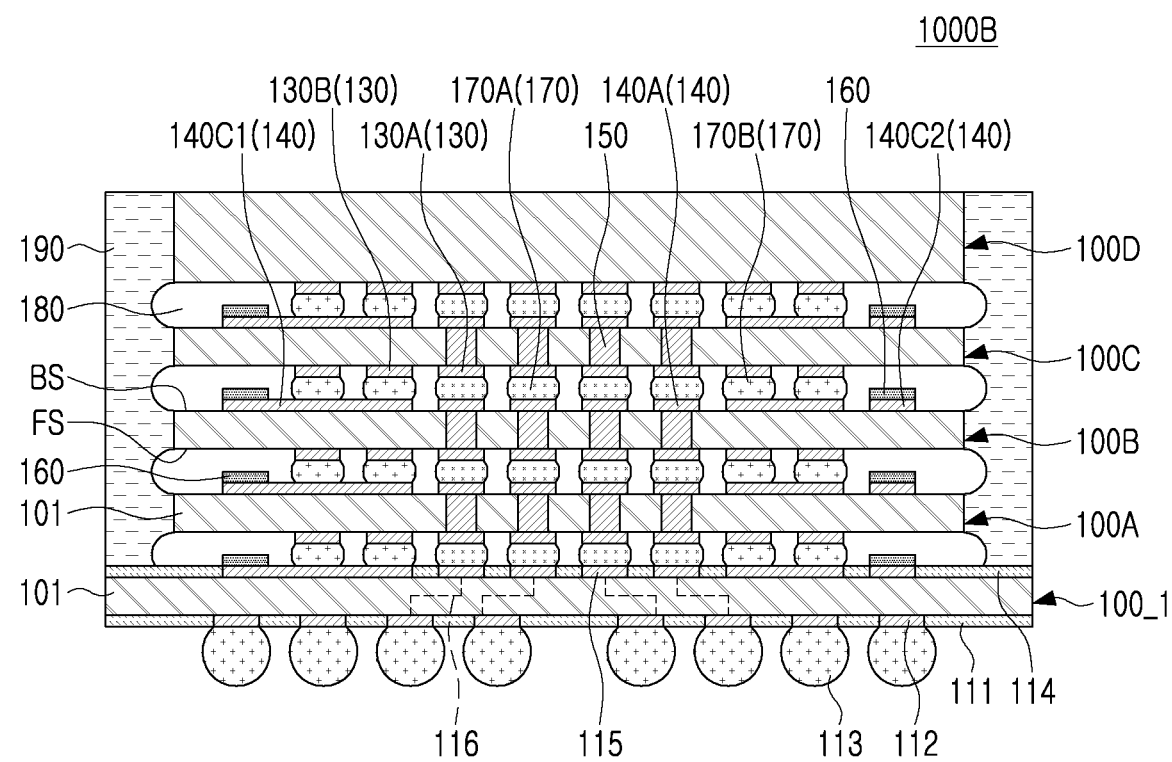
FIG. 9 is a cross-sectional view illustrating a semiconductor package according to an example embodiment of the present inventive concept.

FIG. 9 is a cross-sectional view illustrating a semiconductor package according to an example embodiment of the present inventive concept.

Referring to FIG. 9, a semiconductor package 1000B may include a package substrate 100_1, rather than a base chip 100, and a plurality of semiconductor chips 100A, 100B, 100C, and 100D may be stacked on the package substrate 100_1. A lower solder resist layer 111, lower package pads 112, and solder balls 113 may be disposed below the package substrate 100_1. An upper solder resist layer 114 and package upper pads 115 may be disposed on the package substrate 100_1. The package substrate 1001 might not include through-vias, and may include an internal wiring structure 116 electrically connecting the lower package pads 112 and the upper package pads 115 to each other.

Figure 10:
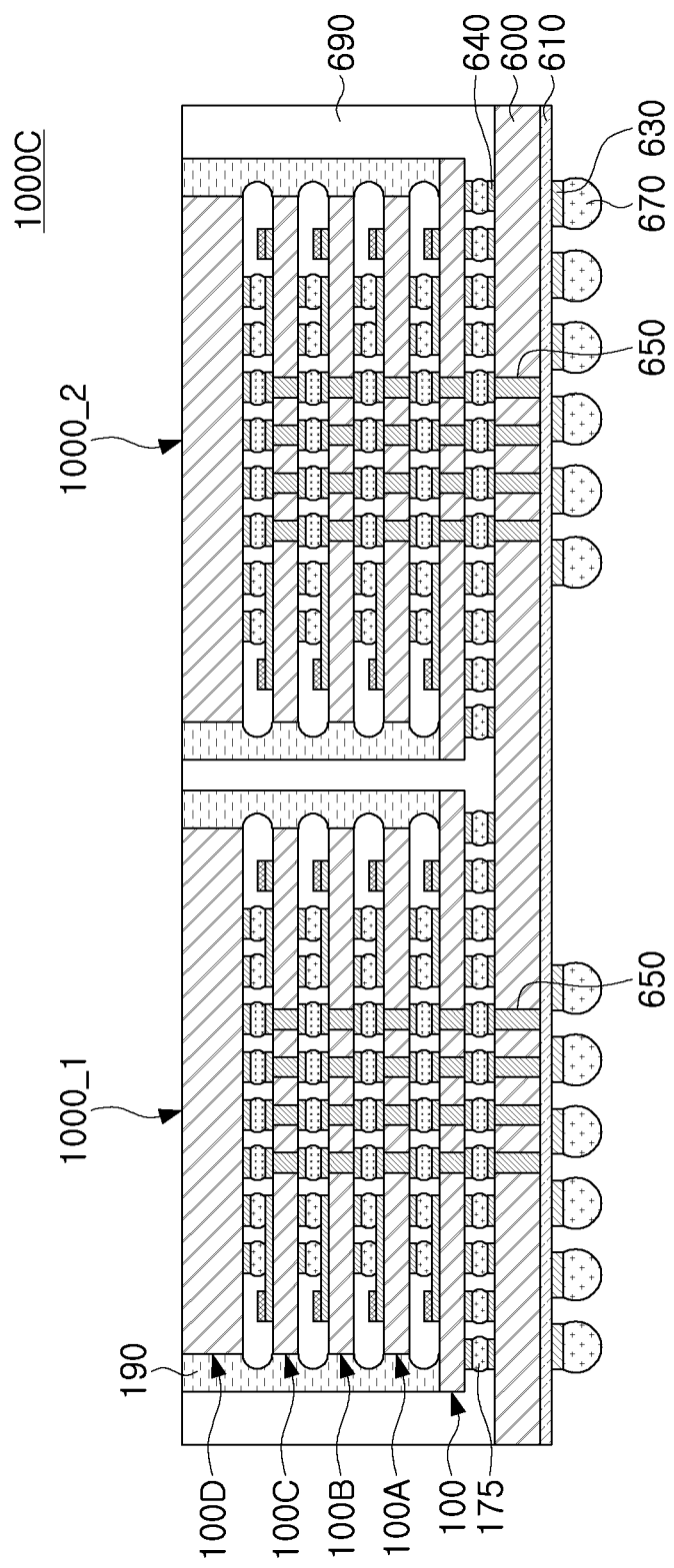
FIG. 10 is a cross-sectional view illustrating a semiconductor package according to an example embodiment of the present inventive concept.

FIG. 10 is a cross-sectional view illustrating a semiconductor package according to an example embodiment of the present inventive concept.

Referring to FIG. 10, a semiconductor package 1000C according to an example embodiment of the present inventive concept may further include an interposer substrate 600, an interposer insulating adhesive layer 660, and an interposer encapsulant 690. At least two semiconductor packages 1000A illustrated in FIG. 1 may be disposed adjacent to each other on the interposer substrate 600. Hereinafter, at least two semiconductor packages 1000A will be referred to as a first chip structure 1000_1 and a second chip structure 1000_2, respectively.

The interposer substrate 600 may include a semiconductor substrate 601, a lower passivation layer 610, a lower pad 630, an upper pad 640, interposer bumps 670, and interposer through-vias. The interposer substrate 600 may be disposed on a package substrate that is disposed below the interposer substrate 600. The package substrate may be a substrate for a semiconductor package including a printed circuit board (PCB), a ceramic substrate, a glass substrate, a tape wiring board, or the like.

The semiconductor substrate 601 may include, for example, silicon (Si). Therefore, the interposer substrate 600 may be referred to as a silicon interposer.

A lower passivation layer 610 may be disposed on a lower surface of the semiconductor substrate 601, and a lower pad 630 may be disposed on the lower passivation layer 610. The lower pad 630 may be connected to a through-via 650. Chip structures 1000_1 and 1000_2 may be electrically connected to the package substrate through the interposer bumps 670 disposed on lower pads 630.

The interposer bump 670 may be disposed on a lower surface of the interposer substrate 600, and may be electrically connected to wiring layers inside the interposer substrate 600.

The interposer encapsulant 690 may be disposed on the interposer substrate 600, and may cover the chip structures 1000_1 and 1000_2. The interposer encapsulant 690 may include an insulating material, for example, an epoxy molding compound (EMC).

FIGS. 11A to 11D are cross-sectional views illustrating a process flow of manufacturing a semiconductor package according to an example embodiment of the present inventive concept.

Referring to FIG. 11A, an active layer 105 including a plurality of elements may be formed on a semiconductor wafer 100W including a substrate 101, and through-vias 150, a front insulating layer 110, and front pad fields 130 may be formed. The semiconductor chip structures 100P may be divided by scribe lanes (illustrated as bold dashed lines) in the semiconductor wafer 100W.

Referring to FIG. 11B, a plurality of bumps 170 may be formed on the front pads 130 of the semiconductor wafer 100W, and the semiconductor wafer 100W may be bonded to a carrier using an adhesive material layer 20. The semiconductor wafer 100W may be attached to the carrier 10 such that lower surfaces of the semiconductor chip structures 100_P, on which the front pads 130 are disposed, are directed toward the adhesive material layer 20. The front pads 130 may be covered with the adhesive material layer 20, and a lower surface of the semiconductor wafer 100W may contact an upper surface of the adhesive material layer 20.

Figure 11C:
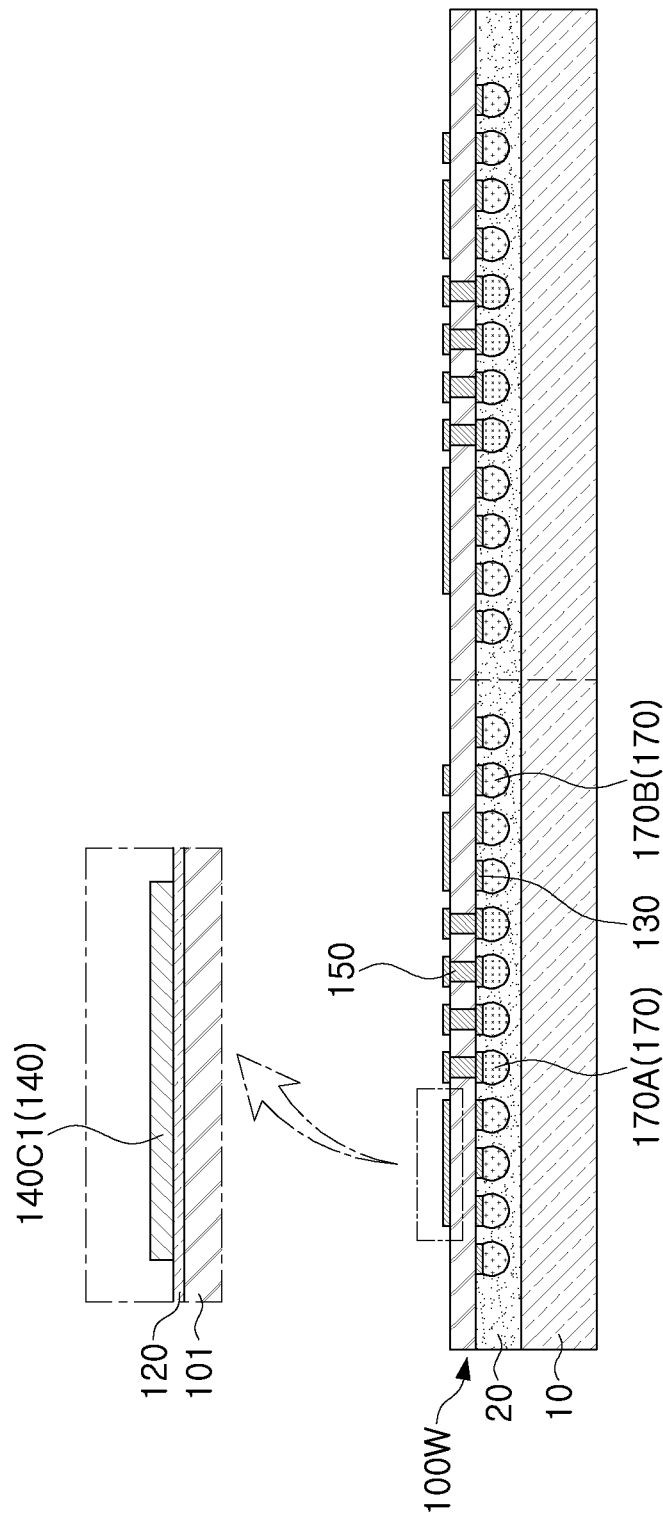

Referring to FIG. 11C, a polishing process may be performed on the upper surface of the semiconductor wafer 100W to reduce a thickness of the substrate 101, and a rear insulating layer 120 and rear pads 140 may be formed on the upper surface of the semiconductor wafer 100W. Upper surfaces of the through-vias 150 may be exposed by the polishing process. The polishing process may be a grinding process such as a chemical mechanical polishing (CMP) process, an etch-back process, or a combination thereof. As illustrated in the enlarged view, a portion of the rear pads 140 may be line pads 140C1 extending in one direction. The rear pads 140 may be formed of at least one of, for example, aluminum (Al), copper (Cu), nickel (Ni), titanium (Ti), tantalum (Ta), tungsten (W), platinum (Pt), and/or gold (Au).

Figure 11D:
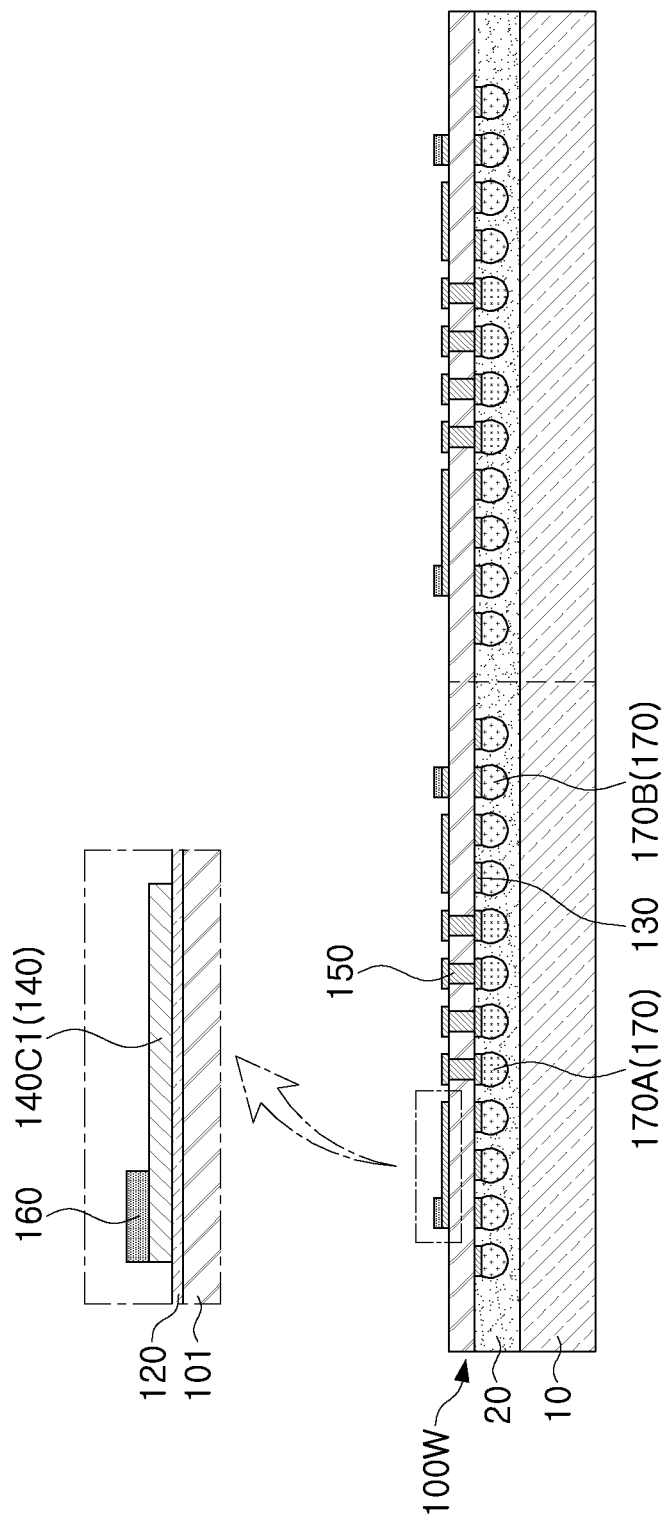

Referring to FIG. 11D, dam structures 160 may be formed on line pads 140C1 and/or an external pad 140C2. The dam structures 160 may have a planar shape, similar to a planar shape of the line pads 140C1 and/or the outer pads 140C2, or may be disposed to at least partially surround at least a periphery of a center region CR of a rear surface BS of a semiconductor chip structure 100_P. For example, the dam structures 160 may have various shapes such as an I-shape, a reverse L-shape, an L-shape, a C-shape, or the like, as illustrated in FIGS. 6A to 6D and 8. For example, the dam structures 160 may have a bent shape in plan view. The dam structures 160 may be formed of at least one of, for example, aluminum (Al), copper (Cu), nickel (Ni), titanium (Ti), tantalum (Ta), tungsten (W), platinum (Pt), and gold (Au).

Then, the semiconductor wafer 100W may be cut along scribe lanes to be divided into a plurality of semiconductor chips 100A. The adhesive material layer 20 and carrier 10 may be removed. An adhesive film may be attached to a lower portion of each of the plurality of semiconductor chips 100A, and a thermal compression (TC) process may be performed on an additional semiconductor wafer including the base chip 100 to bond a semiconductor chip 100A to the additional semiconductor wafer. During the thermal compression bonding process, the adhesive film may be reflowed and cured to form an insulating adhesive layer 180. By repeating such processes, a plurality of semiconductor chips 100A, 100B, 100C, and 100D may be stacked as illustrated in FIG. 1. Then, the additional semiconductor wafer may be cut along scribe lanes to be divided into base chips 100.

While a chip-on-wafer packaging method has been described in the present inventive concept, the present inventive concept may be applied to a chip-on-chip packaging method or a wafer-on-wafer packaging method.

As described above, when a plurality of semiconductor chips are packaged, a line pad and a dam structure may be disposed in a region of a rear surface of a semiconductor package. Thus, a semiconductor package having increased heat dissipation and increased reliability may be provided.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package comprising:
a base chip;
semiconductor chips disposed on the base chip and including front pads disposed on a front surface opposing the base chip, rear pads disposed on a rear surface opposing the front surface, and through-vias;
bumps disposed between the semiconductor chips;
a dam structure disposed on at least a portion of the rear pads; and
insulating adhesive layers at least partially surrounding the bumps and the dam structure,
wherein the rear pads include first pads that are disposed in a center region that crosses a center of the rear surface and that are electrically connected to the through-vias, and second pads that are disposed in a peripheral region adjacent to the center region,
wherein the second pads include a line pad of which at least a portion has a polygonal shape, and
wherein the dam structure has a bent shape.

2. The semiconductor package of claim 1, wherein the bumps include first bumps, which are electrically connected to the through-vias, and second bumps, which are spaced apart from through-vias, and
at least two of the second bumps are disposed on the line pad.

3. The semiconductor package of claim 1, wherein the first pads are electrically connected to the through-vias, and the second pads are spaced apart from the through-vias.

4. The semiconductor package of claim 1, wherein the dam structure is disposed on the line pad.

5. The semiconductor package of claim 1, wherein a thickness of the dam structure ranges from about 0.5 times to about twice a thickness of the line pad.

6. The semiconductor package of claim 1, wherein a thickness of the dam structure is greater than a thickness of the line pad.

7. The semiconductor package of claim 1, wherein a thickness of the dam structure is smaller than a thickness of the line pad.

8. The semiconductor package of claim 1, wherein a thickness of the line pad ranges from about 1.5 μm to about 3 μm.

9. The semiconductor package of claim 1, wherein the line pad includes a first line portion, which extends in a first direction, and a second line portion extending in a second direction, intersecting the first direction.

10. The semiconductor package of claim 1, wherein the dam structure includes a first dam line portion, extending in a first direction, and a second dam line portion extending in a second direction, intersecting the first direction.

11. A semiconductor package comprising:
a first semiconductor chip including first front pads and first rear pads;
a second semiconductor chip including second front pads and second rear pads opposing the first rear pads;
bumps disposed between the first semiconductor chip and the second semiconductor chip;
a dam structure disposed in an edge region of a rear surface of the first semiconductor chip; and
an insulating adhesive layer at least partially surrounding the bumps and the dam structure,
wherein each of the first rear pads includes a dummy pad and a line pad,
wherein the line pad has a length, equal to or greater than about twice a diameter of the dummy pad or equal to or greater than about twice a width of the dummy pad in a length direction, and
wherein the dam structure is disposed on the line pad and has a bent shape.

12. The semiconductor package of claim 11, wherein the diameter or the width of the dummy pad ranges from about 13 μm to about 20 μm, and
the length of the line pad ranges from about 30 μm to about 35 μm.

13. The semiconductor package of claim 11, wherein a thickness of the line pad ranges from about 1.5 μm to about 3 μm, and
a thickness of the dam structure ranges from about 1.5 μm to about 3 μm.

14. The semiconductor package of claim 11, wherein the line pad vertically overlaps at least two of the second front pads.

15. The semiconductor package of claim 11, wherein the line pad includes a bent portion.

16. The semiconductor package of claim 11, wherein the insulating adhesive layer includes a fillet portion protruding beyond an external side surface of the first semiconductor chip.

17. A semiconductor package comprising:
a base chip including lower bumps;
semiconductor chips disposed on the base chip, and including front pads, rear pads, and through-vias, wherein the front pads are disposed on front surfaces, facing away from the base chip, of the semiconductor chips, wherein the rear pads are disposed on rear surfaces, opposing the front surfaces, of the semiconductor chips, and through-vias;

bumps disposed between the semiconductor chips;
a dam structure disposed on at least a portion of the rear pads; and
insulating adhesive layers at least partially surrounding the bumps and the dam structure,
wherein the rear pads include first pads, which are disposed in a center region that crosses a center of each of the rear surfaces and are electrically connected to the through-vias, and second pads that are disposed in a peripheral region around the center region, and
wherein the second pads include a first line pad, extending in a first direction, and a second line pad extending in a second direction, intersecting the first direction.

18. The semiconductor package of claim 17, wherein the first line pad and the second line pad do not overlap the through-vias in a vertical direction.

19. The semiconductor package of claim 17, wherein each of the first pads has a first diameter,
a length of the first line pad in the first direction is greater than the first diameter, and
a length of the second line pad in the second direction is greater than the first diameter.

20. The semiconductor package of claim 17, wherein the base chip includes a base substrate and base through-electrodes penetrating through the base substrate and electrically connecting to the front pads of the semiconductor chips, and
wherein the semiconductor package further comprises an interposer substrate disposed on the base chip and including connection pads electrically connected to the base through-electrodes.

\* \* \* \* \*